United States Patent
Xiao et al.

(10) Patent No.: US 12,446,182 B2
(45) Date of Patent: Oct. 14, 2025

(54) COMPLETE MACHINE STRUCTURE

(71) Applicants: Beijing BOE Display Technology Co., Ltd., Beijing (CN); BOE TECHNOLOGY GROUP CO., LTD., Beijing (CN)

(72) Inventors: Chunlei Xiao, Beijing (CN); Yang Shi, Beijing (CN); Hetao Wang, Beijing (CN); Qian Cheng, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/926,182

(22) PCT Filed: Dec. 16, 2021

(86) PCT No.: PCT/CN2021/138639
§ 371 (c)(1),
(2) Date: Nov. 18, 2022

(87) PCT Pub. No.: WO2023/108517
PCT Pub. Date: Jun. 22, 2023

(65) Prior Publication Data
US 2024/0237315 A1 Jul. 11, 2024

(51) Int. Cl.
*H05K 7/20* (2006.01)
(52) U.S. Cl.
CPC ..... *H05K 7/20145* (2013.01); *H05K 7/20209* (2013.01); *H05K 7/20972* (2013.01)
(58) Field of Classification Search
CPC ........... H05K 7/20145; H05K 7/20209; H05K 7/20972
See application file for complete search history.

(56) References Cited

U.S. PATENT DOCUMENTS

2013/0094246 A1* 4/2013 Kim .......................... G09F 9/35
362/613
2015/0362663 A1* 12/2015 Chiu .................... G02B 6/0068
362/606

(Continued)

FOREIGN PATENT DOCUMENTS

| CN | 203519962 U | 4/2014 |
| CN | 205121108 U | 3/2016 |

(Continued)

OTHER PUBLICATIONS

China Patent Office, First Office Action dated Jun. 14, 2025, for corresponding CN application No. 202180003998.9.

*Primary Examiner* — Christopher E Dunay
(74) *Attorney, Agent, or Firm* — HOUTTEMAN LAW, LLC

(57) ABSTRACT

The present disclosure provides a complete machine structure, including a display module and a complete machine exterior frame. The display module includes a display panel and a front frame, the front frame including a front frame side edge on an outer side of a side edge of the display panel. The complete machine exterior frame includes at least one outer frame side edge each located on a side of the front frame side edge away from the display panel, and in contact with the front frame side edge. When a total contact area of all outer frame side edges and corresponding front frame side edges satisfies a certain condition, heat transferred from the display module to the complete machine exterior frame can be reduced by controlling the total contact area.

17 Claims, 7 Drawing Sheets

(56) References Cited

U.S. PATENT DOCUMENTS

| | | | |
|---|---|---|---|
| 2024/0064945 A1* | 2/2024 | Du | H04M 1/0266 |
| 2024/0260213 A1* | 8/2024 | Oh | G09F 9/3026 |
| 2025/0044626 A1* | 2/2025 | Hua | G02F 1/133385 |
| 2025/0151247 A1* | 5/2025 | Kim | H05K 7/20972 |

FOREIGN PATENT DOCUMENTS

| | | |
|---|---|---|
| CN | 105549263 A | 5/2016 |
| CN | 207440463 U | 6/2018 |
| CN | 109270737 A | 1/2019 |
| CN | 210323451 U | 4/2020 |
| CN | 210378183 U | 4/2020 |
| CN | 214098027 U | 8/2021 |
| JP | 2005037814 A | 2/2005 |
| JP | 2005114851 A | 4/2005 |
| TW | 707182 | 10/2020 |
| WO | WO 2019163555 A1 | 8/2019 |

* cited by examiner

COMPLETE MACHINE STRUCTURE

CROSS-REFERENCE TO RELATED APPLICATION

This is a National Phase Application filed under 35 U.S.C. 371 as a national stage of PCT/CN2021/138639, filed on Dec. 16, 2021, the contents of which are incorporated herein in their entirety by reference.

TECHNICAL FIELD

The present disclosure relates to the field of display technology, and specifically relates to a complete machine structure.

BACKGROUND

In the conventional complete machine structure, the display module may produce a great deal of heat that is transferred to the complete machine exterior frame. For example, after operating for several hours at room temperature, the complete machine exterior frame of a broadcasting level monitor may have a temperature higher than 50° C., which brings about poor use experience.

SUMMARY

To solve at least one of the technical problems in the existing art, the present disclosure provides a complete machine structure which can not only avoid an overhigh temperature of the complete machine exterior frame, but also ensure sufficient strength of the outer frame side edge, so that the service life of the complete machine exterior frame can be increased, and the use experience can be improved.

To achieve the above object, the present disclosure provides a complete machine structure, including a display module and a complete machine exterior frame, wherein the display module includes a display panel and a front frame, the front frame includes a front frame side edge on an outer side of a side edge of the display panel; the complete machine exterior frame includes at least one outer frame side edge each located on a side of the front frame side edge away from the display panel, and in contact with the front frame side edge, and a total contact area of all outer frame side edges and corresponding front frame side edges satisfies:

$$S \leq \frac{L \times P}{K \times (T_1 - T_2)}$$

where S is the total contact area; L is a maximum width of the outer frame side edge at a position where the outer frame side edge is in contact with the front frame side edge in a direction perpendicular to a contact surface of the outer frame side edge with the front frame side edge; P is a power of the display module, which is a sum of a power of the display panel and a power of a backlight module of the display module; K is a heat conductivity coefficient of the outer frame side edge; $T_1$ is a temperature of the display module at an ambient temperature of 20° C., wherein the temperature of the display module is defined as an actual temperature of the display module detected on a printed circuit board thereof at a preset ambient temperature when the display module of the complete machine structure is turned on to present a static image and reaches a temperature stable state; $T_2$ is a maximum allowable temperature on a surface of the outer frame side edge away from the display module at an ambient temperature of 20° C.; and $T_2$ is less than or equal to 50° C.

In an embodiment, the total contact area of all outer frame side edges and corresponding front frame side edges satisfies:

$$r \times \left( \frac{L \times P}{K \times (T_1 - T_2)} \right) \leq S \leq \frac{L \times P}{K \times (T_1 - T_2)}$$

where r takes a value in a range of [0.5,1).

In an embodiment, r=0.8.

In an embodiment, the maximum allowable temperature $T_2$ of the outer frame side edge is 38° C.

In an embodiment, the power of the display module is greater than or equal to 190 W.

In an embodiment, the outer frame side edge is spaced apart from the front frame side edge, the outer frame side edge has a contact structure, and a surface of the contact structure in contact with the front frame side edge is the contact surface; and a number of the contact surface is two or more, the two or more contact surfaces being uniformly distributed on an inner surface of the outer frame side edge facing the front frame side edge; or a number of the contact surface is one, the one contact surface being in linear contact with the front frame side edge.

In an embodiment, the plurality of contact surfaces have a same shape and a same area.

In an embodiment, the contact structure includes a plurality of contact parts, each of the contact parts has one of the contact surfaces thereon; at least part of the contact parts are provided with mounting holes penetrating through the contact parts in a direction perpendicular to the contact surface; and the complete machine structure further includes screws, a number of the screws is the same as a number of the mounting holes, and the screws pass through the mounting holes in one-to-one correspondence to be connected to the front frame side edge.

In an embodiment, a comb-teeth shaped protruding structure is provided on the inner surface of the outer frame side edge and between each two adjacent contact parts, and the protruding structure is spaced apart from the front frame side edge.

In an embodiment, the complete machine structure further includes a rear case, the rear case includes a rear plate on a side of the display module away from a light-emitting surface of the display module, and a rear case side edge connected to the complete machine exterior frame, wherein the rear case side edge and the rear plate form a heat dissipation space on an outer side of a back plate of the display module, a heat dissipation device is provided in the heat dissipation space to dissipate heat generated by the display module; and the rear case includes an air inlet and an air outlet.

In an embodiment, at least one air outlet is provided at a position on the rear plate near the rear case side edge at a sky side, and a first air inlet is provided at a position on the rear plate near the rear case side edge at a ground side; and the heat dissipation device includes a fan, and the fan is disposed at a position near the air outlet and configured to blow air to the air outlet.

In an embodiment, a second air inlet is further provided at a position near the first air inlet on the rear case side edge at the ground side.

In an embodiment, a volume of air discharged by all fans per minute is defined as a CMM sum value, which is greater than or equal to a ratio of a CMM target value to an aperture ratio of the air outlet; and the CMM target value $CMM_{target}$ satisfies:

$$CMM_{target} = \frac{Q}{\Delta T \times M \times C_p}$$

where ΔT is a difference between the temperature of the display module and 38° C. when an ambient temperature is 38° C.; M is a unit air mass of standard air; $C_p$ is a constant pressure specific heat of standard air; and Q is heat generated by the complete machine structure in one minute of operation; and the temperature of the display module is in a range of 40° C. to 60° C.

In an embodiment, at an ambient temperature of 38° C., the temperature of the display module is greater than or equal to 45° C., and/or, the temperature of the display module is less than or equal to 48° C.

In an embodiment, the heat dissipation device further includes a baffle, and the fan is opposite to one of the air outlets; and the baffle is disposed between the fan and the air outlet opposite to the fan, and configured to form a discharge channel between the fan and the air outlet.

In an embodiment, the complete machine structure further includes a heat sink assembly on a side of the back plate of the display module.

In an embodiment, the complete machine structure further includes a semiconductor thermally conductive module, wherein the semiconductor heat conductive module is mounted between the back plate of the display module and the heat sink assembly; and the semiconductor heat conductive module is connected to the heat sink assembly and configured to conduct heat generated by the display module to the heat sink assembly.

The present disclosure has the following beneficial effects:

The complete machine structure provided in the embodiments of the present disclosure includes a display module and a complete machine exterior frame. The complete machine exterior frame includes at least one outer frame side edge each located on a side of the front frame side edge of the display module relatively away from the display panel, and in contact with the front frame side edge. A total contact area of all outer frame side edges and corresponding front frame side edges satisfies:

$$S \leq \frac{L \times P}{K \times (T_1 - T_2)}.$$

With the total contact area satisfying the above condition, heat transferred from the display module to the complete machine exterior frame can be reduced, so that the temperature of the complete machine exterior frame will not become too high, the service life of the complete machine exterior frame can be increased, and the use experience can be improved, while ensuring sufficient strength of the outer frame side edge, so that strength of the complete machine exterior frame, and thus the structural stability, are improved.

DETAIL DESCRIPTION OF EMBODIMENTS

To better understand the technical solution of the present disclosure for those skilled in the art, the complete machine structure of the present disclosure will be described in detail below in conjunction with the accompanying drawings.

For convenience of description, when the complete machine structure of the present disclosure is placed on a horizontal plane in a designated mode, an upward side of the complete machine structure is called a sky side, a downward side is called a ground side, and the two sides in an orientation parallel to the horizontal plane are called a left side and a right side, respectively. The designated mode is usually a customary placement orientation of the complete machine structure. For example, if the complete machine structure has a stand, the designated mode is such that when the complete machine structure is placed on the horizontal plane, the stand is disposed at a bottom of the complete machine structure to support the complete machine structure. The designated mode may be understood as a placement mode of the complete machine structure in a normal use state.

Figure 2:
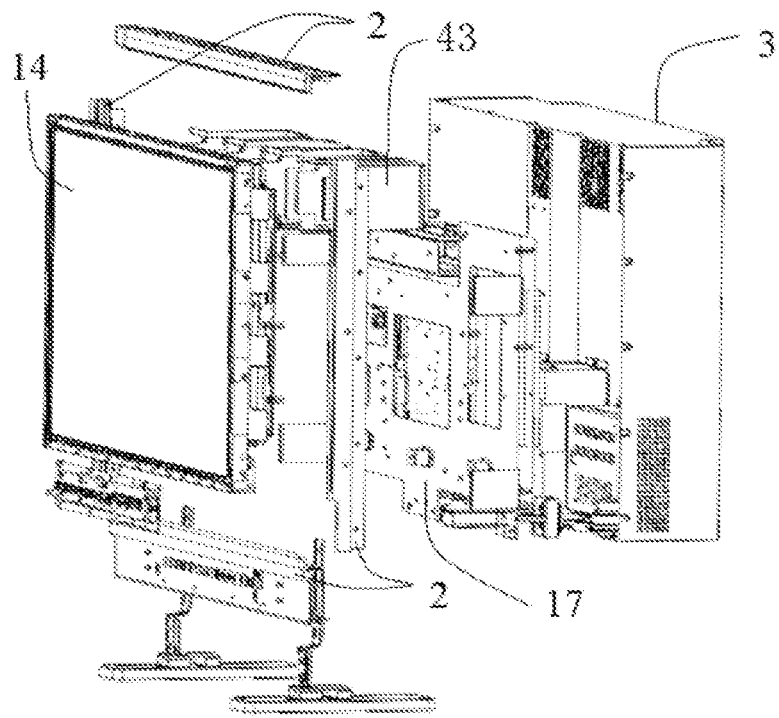
FIG. 2 is an exploded structural diagram of a complete machine structure according to an embodiment of the present disclosure.
Figure 5:
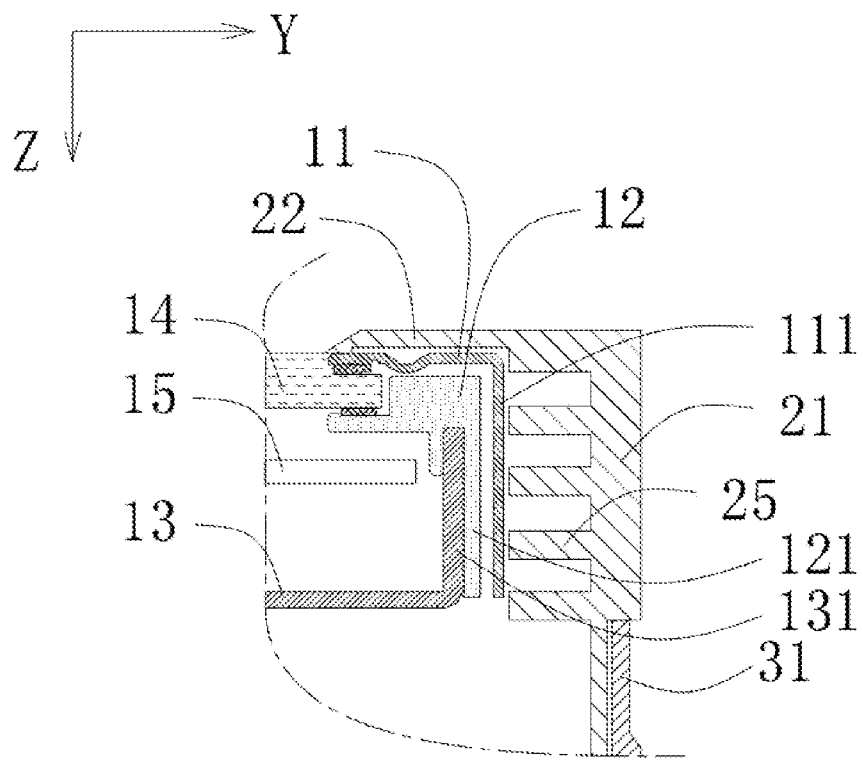
FIG. 5 is a partial sectional view of a complete machine structure at a comb-teeth shaped protruding structure according an embodiment of the present disclosure.

The complete machine structure provided in the embodiments of the present disclosure includes a display module 1 which, for example, has a structure as shown in FIGS. 2 and 5. The display module 1 includes a display panel 14 and a backlight module 15 on a side of the display panel 14 away from a light-emitting surface. The backlight module 15 is merely schematically shown in FIG. 5, and includes, for example, a light guide plate, a backlight source and a corresponding functional membrane material. Moreover, the display module 1 further includes a front frame 11, a module middle frame 12 and a back plate 13. The module middle frame 12 surrounds a side edge of the display panel 14 and a side edge of the backlight module 15, and has a middle frame side edge 121. The front frame 11 has a front frame side edge 111. The back plate 13 is located on a side of the backlight module 15 away from the display panel 14, and has a back plate side edge 131, and the middle frame side edge 121 is located on an outer side (i.e., a side away from the backlight module 15) of the back plate side edge 131, while the front frame side edge 111 is located on an outer side (i.e., a side away from the back plate side edge 131) of the middle frame side edge 121.

Figure 1:
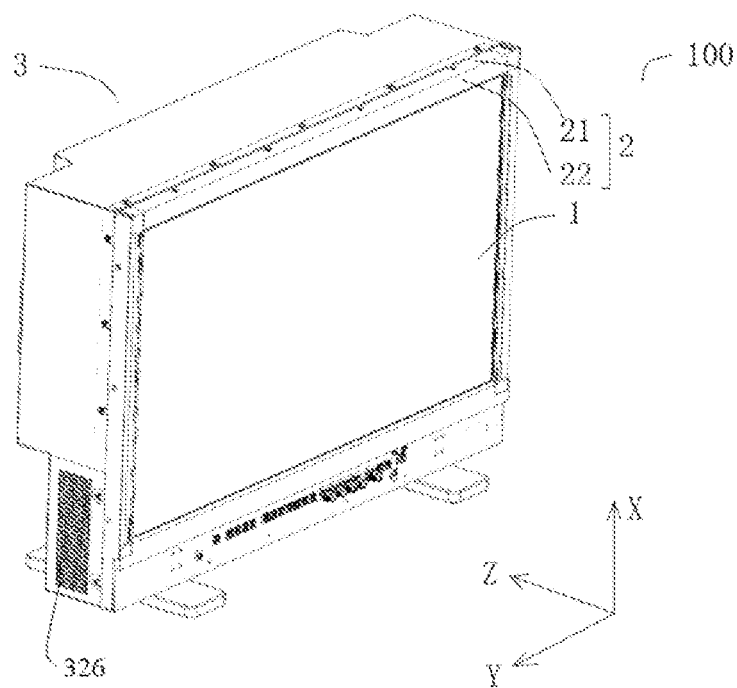
FIG. 1 is an external structural diagram of a complete machine structure according to an embodiment of the present disclosure.
Figure 4:
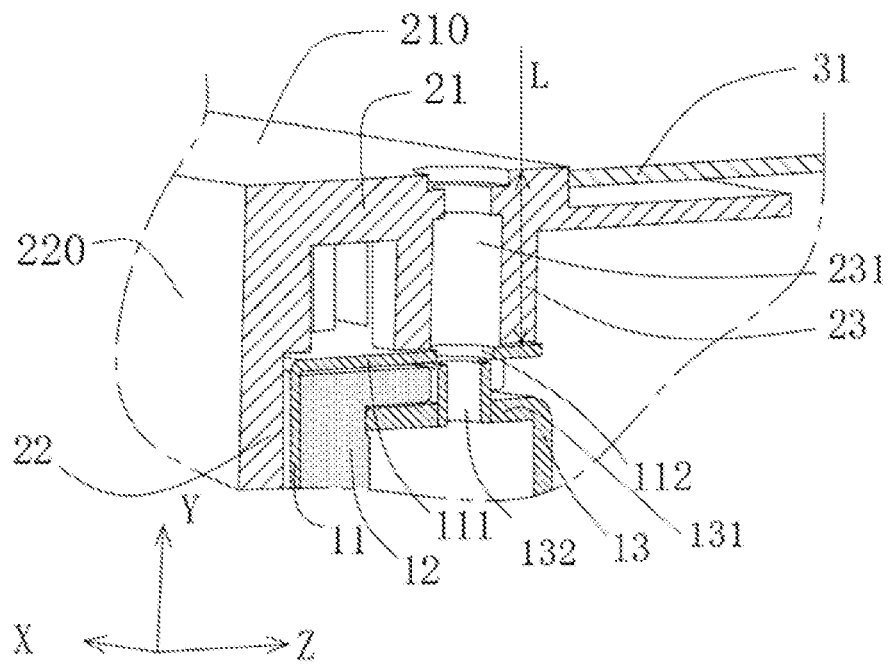
FIG. 4 is a partial sectional view of a complete machine structure at a contact structure according an embodiment of the present disclosure.

As shown in FIGS. 1 and 2, the complete machine structure provided in the embodiments of the present disclosure further includes a complete machine exterior frame 2 on an outer side (i.e., a side away from the display panel 14) of the front frame 11. As shown in FIGS. 1, 4 and 5, the complete machine exterior frame 2 includes an outer frame side edge 21 and an outer frame front edge 22. For example, four strip-shaped outer frame side edges 21 are provided correspondingly and respectively outside four edges of the display module 1. Apparently, embodiments of the present disclosure are not limited thereto, and in practical applications, one, two or three outer frame side edges 21 may be provided as specifically needed.

Outer frame front edges 22 of the same number as, and arranged in one-to-one correspondence with, the outer frame side edges 21 are provided. The front frame 11 and the outer frame front edges 22 are arranged in sequence along a light-emitting direction of the display panel 14, and each outer frame front edge 22 includes a surface 220 away from the display module. Each outer frame side edge 21 is located on an outer side (i.e., a side away from the display panel 14) of the front frame side edge 111, and includes a surface 210 away from the display module. Specifically, each outer frame side edge 21 and each outer frame front edge 22 completely cover the corresponding front frame 11 and the front frame side edge 111 thereof. Apparently, embodiments of the present disclosure are not limited thereto, and in practical applications, the outer frame front edge 22 may partially cover the corresponding front frame 11, or may be omitted, which is not particularly limited in the embodiments of the present disclosure.

Each outer frame side edge 21 is in contact with the front frame side edge 111, and a sum contact area of all outer frame side edges 21 and corresponding front frame side edges 111, that is, a product of a contact area of each outer frame side edge 21 with the corresponding front frame side edge 111 and the number of outer frame side edges 21 (hereafter the "total contact area") is set to be able to reduce heat transferred from the display module to the complete machine exterior frame, so that a temperature of the complete machine exterior frame 2 is controlled under a preset maximum allowable temperature, while ensuring sufficient strength of the outer frame side edges 21 and improving strength of the complete machine exterior frame 2. In other words, under the prerequisite of guaranteeing that a printed circuit board (PCB) in the display module 1 satisfies operating limits, the temperature of complete machine exterior frame 2 may be controlled by controlling a thermal resistance between the display module 1 and the outer frame side edge 21, i.e., by controlling the total contact area of the outer frame side edges 21 and the front frame side edges 111 as described above. In this manner, an overhigh temperature of the complete machine exterior frame 2 can be avoided, the service life of the complete machine exterior frame 2 can be increased, and the use experience can be improved, while strength of the complete machine exterior frame 2, and thus the structural stability, are improved.

Specifically, the display module 1 may be regarded as a heat source as a whole, the heat source and the outer frame side edge 21 may be regarded as two different media, and a thermal resistance between the two may be expressed by:

$$R = \frac{(T_1 - T_2)}{P}$$

where R is the thermal resistance between the heat source (i.e., the display module 1) and the outer frame side edge 21; $T_1$ is a temperature of the display module 1 at an ambient temperature of 20° C., where the temperature of the display module 1 is defined as an actual temperature of the display module 1 detected on a printed circuit board (PCB) thereof at a preset ambient temperature when the display module 1 of the complete machine structure is turned on to present a static image and reaches a temperature stable state; and $T_2$ is a maximum allowable temperature on a surface 210 of the outer frame side edge 21 away from the display module 1 at an ambient temperature of 20° C.; and $T_2$ is less than or equal to 50° C. The fact that the maximum allowable temperature $T_2$ on the surface 210 of the outer frame side edge 21 away from the display module 1 is less than or equal to 50° C. may be understood as that the temperature at any position of the surface 210 of the outer frame side edge 21 away from the display module 1 does not exceed 50° C. In this temperature range, the user will not feel hot when touching the outer frame side edge 21, so that a better user experience is obtained.

In a specific embodiment, a plane where the surface 210 of the outer frame side edge 21 away from the display module is located may be perpendicular to a plane where a light-emitting surface of the display panel 14 is located.

Further, when the complete machine exterior frame 2 includes the outer frame front edge 22, the outer frame front edge 22 may have less or no contact with the display module 1. In this case, a maximum allowable temperature on the surface 220 of the outer frame front edge 22 away from the display module 1 may be also less than or equal to 50° C., within which temperature range the user will not feel hot when touching the outer frame front edge 21, so that a better user experience is obtained.

In a specific embodiment, a plane where the surface 220 of the outer frame front edge 22 away from the display module is located may be parallel to the plane where the light-emitting surface of the display panel 14 is located.

The fact that the complete machine structure is turned on to present a static image and reaches a temperature stable state may be understood as a state in which after the complete machine structure is on for a certain time period at the preset ambient temperature, no notable change in temperature is found on different parts of the complete machine structure. In a specific test, the static image may be an image in which all pixels display an L255 state. In a specific test, the time period during which no notable change in temperature is found on different parts of the complete machine structure may be greater than or equal to 30 minutes.

It will be appreciated that $T_1$ is greater than $T_2$.

Since the outer frame side edge 21 is in contact with the front frame side edge 111, and the heat therebetween is transferred by heat conduction, the thermal resistance between the outer frame side edge 21 and the display module 1 is a thermal-conduction resistance, which may be expressed by:

$$R_{conduction} = \frac{L}{K \times S}$$

where R is the thermal-conduction resistance between the heat source (i.e., the display module 1) and the outer frame side edge 21, which is equal to the thermal resistance R described above; and L is a maximum width of the outer frame side edge 21 at a position where the outer frame side edge 21 is in contact with the front frame side edge 111 in a direction perpendicular to a contact surface of the outer frame side edge 21 with the front frame side edge 111 (i.e., a direction parallel the direction Y in FIG. 4). The maximum width L of the outer frame side edge 21 may be set as specifically needed. K is a heat conductivity coefficient of the outer frame side edge 21; For example, for an outer frame side edge 21 of an aluminum magnesium alloy, the heat conductivity coefficient is 160° C./m. P is a power of the display module 1, which is, for example, a sum of the power of the display panel 14 and the power of the backlight module 15.

Specifically, in consideration of the strength of the outer frame side edge 21, the maximum width L of the outer frame side edge 21 may be designed to be 10 mm or more. Preferably, considering both the strength of the outer frame side edge 21 and in order to prevent the temperature of the outer frame side edge 21 from rising too high, the maximum width L of the outer frame side edge 21 may be designed between 11.5 mm to 12.5 mm.

For example, the power P of the display module is greater than or equal to 190 W. For example, the power P of the display module is greater than or equal to 200 W. For example, the power of the display module is greater than or equal to 210 W. For example, the power of the display module is greater than or equal to 220 W. For example, the power of the display module is greater than or equal to 230 W. For example, the power of the display module is greater than or equal to 240 W.

For example, the power of the display module is less than or equal to 250 W. For example, the power of the display module is less than or equal to 300 W. For example, the power of the display module is less than or equal to 350 W. For example, the power of the display module is less than or equal to 400 W.

Since $R=R_{conduction}$, it may be derived that the total contact area of the outer frame side edge 21 and the front frame side edge 111 satisfies:

$$S \leq \frac{L \times P}{K \times (T_1 - T_2)}$$

where S is the total contact area. By setting a proper total contact area, a desired thermal resistance can be obtained, so that the temperature of the complete machine exterior frame 2 can be controlled below the maximum allowable temperature (i.e., the maximum allowable temperature $T_2$ of the outer frame side edge 21).

Preferably, $T_2$ may be less than or equal to 48° C. Preferably, $T_2$ may be less than or equal to 47° C. Preferably, $T_2$ may be less than or equal to 45° C. Preferably, $T_2$ may be less than or equal to 42° C. Preferably, $T_2$ may be less than or equal to 40° C.

Further preferably, $T_2$ may be less than or equal to 38° C. For example, setting $T_2$ to 38° C. allows the user to feel a more gentle and comfortable temperature when touching the outer frame side edge, so that a better user experience is obtained.

Further, when the complete machine exterior frame 2 includes the outer frame front edge 22, the outer frame front edge 22 may have less or no contact with the display module 1. In this case, a maximum allowable temperature on the surface 220 of the outer frame front edge 22 away from the display module 1 may be also less than or equal to 38° C., within which temperature range the user can feel a more gentle and comfortable temperature when touching the outer frame front edge 21, so that a better user experience is obtained.

Further, in order to improve the strength of the complete machine exterior frame 2, a value of S may be set within a range of:

$$r \times \left( \frac{L \times P}{K \times (T_1 - T_2)} \right) \leq S \leq \frac{L \times P}{K \times (T_1 - T_2)}$$

where r takes a value in a range of [0.5,1). For example, r may be 0.5, so that the total contact area S is of a reasonable magnitude, and the structural stability can be improved. Preferably, r may be any one of 0.6, 0.7, 0.8, 0.9, or 0.95. For example, when r is 0.8, the complete machine exterior frame 2 can have higher impact resistance, and stability of the complete machine structure can be improved.

By taking a display panel of 31.5 inch as an example, the maximum width L may be set to 12 mm; the power of the display module 1 is 200 W; the actual temperature $T_1$ of the display module 1 is 50° C.; the maximum allowable temperature $T_2$ of the outer frame side edge 21 is 38° C.; and the outer frame side edge 21 is made of an aluminum magnesium alloy, and has a heat conductivity coefficient K of 160° C./m. By substituting the above parameter values into the above equation of the total contact area S, a total contact area S of 1250 mm2 is obtained. Based on this total contact area S, the structure of the outer frame side edge 21 can be designed accordingly.

In some optional embodiments, in order to enable uniform contact between the outer frame side edge 21 and the front frame side edge 111 to improve heat dissipation uniformity and structural stability, the outer frame side edge 21 is spaced apart from the front frame side edge 111, and the outer frame side edge 21 has a contact structure, and a surface of the contact structure in contact with the front frame side edge 111 is the contact surface of the outer frame side edge 21 with the front frame side edge 111. In other words, instead of direct contact, the outer frame side edge 21 is in contact with the front frame side edge 111 via the contact structure. Moreover, a plurality of contact surfaces may be provided and uniformly distributed on an inner surface of at least one outer frame side edge 21 opposite to the front frame side edge 111. Preferably, when a plurality of outer frame side edges 21 are provided, a plurality of contact surfaces are uniformly distributed on the inner surface of each of the plurality of outer frame side edges 21 opposite to the corresponding front frame side edge 111, so that the outer frame side edges 21 can uniformly contact the front frame side edges 111 to improve heat dissipation uniformity and structural stability. As a preferred embodiment, the plurality of contact surfaces have a same shape and a same area. In this manner, the contact uniformity between the outer frame side edge 21 and the front frame side edge 111 can be further improved.

It should be noted that the plurality of contact surfaces contact the front frame side edge 111 in a discrete local contact manner, and each contact surface has a small area to limit the heat conduction efficiency. However, the embodiments of the present disclosure are not limited thereto, and there may be one contact surface in linear contact with the front frame side edge 111. That is, the contact surface has a linear shape, such as a straight line, an arc line, a wavy line or an irregular line or the like. In this case, the contact structure adopts, for example, a thin-walled integral structure, which can also limit the heat conduction efficiency while ensuring the uniformity of heat dissipation. Apparently, in practical applications and based on the actual situation, for example, a situation where uniform heat dissipation is not desired or a situation where concentrated heat dissipation of a local area of the display module is desired, the contact structure may contact the front frame side edge in a designated local area while ensuring sufficient strength of the outer frame side edge. As long as the total contact area between the contact structure and the front frame side edge can be controlled, the temperature of the complete machine exterior frame can still be controlled under the preset maximum allowable temperature.

Figure 3A:
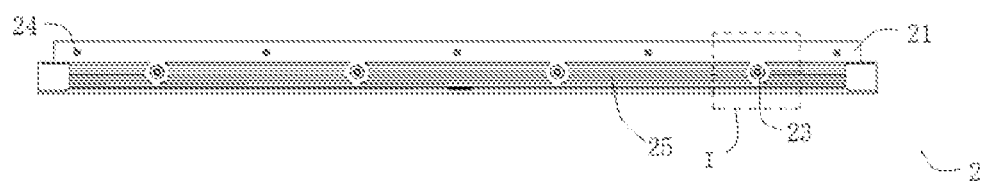
FIG. 3A is an elevation view of an inner surface of a complete machine exterior frame according to an embodiment of the present disclosure.

By taking a plurality of contact surfaces contacting in a discrete local contact manner as an example, in some optional embodiments, FIG. 4 is a partial sectional view of a complete machine structure at a contact structure according an embodiment of the present disclosure. As shown in FIG. 4, the contact structure includes a plurality of contact parts 23 each having one of the contact surfaces thereon. Preferably, the plurality of contact parts 23 are uniformly distributed in a length direction of the outer frame side edge 21, so as to realize uniform heat dissipation. For example, as shown in FIG. 3A, for each complete machine exterior frame 2, four contact parts 23 are provided on the outer frame side edge 21, and a same distance is provided between each two adjacent contact parts 23. Apparently, in practical applications, the number and arrangement of contact parts 23 on different outer frame side edges 21 may differ.

Based on the above contact structure, still taking the display panel of 31.5 inch as an example, the total contact area S obtained from calculation is 1250 mm². On this basis, 14 (which is a total number of contact parts 23 distributed on all outer frame side edges 21) contact parts 23 may be provided, each having a contact surface area of 89 mm². In this manner, the discrete local contact of the outer frame side edge 21 and the front frame side edge 111 is implemented, and it can be ensured that the total contact area S is not greater than 1250 mm².

Further, in some optional embodiments, as shown in FIG. 4, each contact part 23 is a cylindrical outer contour surface, which has a circular cross-sectional shape parallel to the X-Z plane in FIG. 4. In this case, if each contact part 23 has a contact surface area of 89 mm², according to the formula for the area of a circle: $\pi R^2 = 89$ mm², it can be calculated that a radius of the contact part 23 is 5.3 mm. Thereby, the specific structure and size of the contact part 23 can be designed.

In some optional embodiments, as shown in FIG. 4, at least part of the contact parts 23 have mounting holes 231 penetrating the contact part 23 in a direction perpendicular to the contact surfaces of the contact parts 23 (i.e., a direction parallel to the direction Y in FIG. 4), and the complete machine structure further includes screws (not shown) of the same number as the mounting holes 231. The screws pass through the mounting holes in one-to-one correspondence, and pass through mounting holes 112 on the front frame side edge 111 before being screwed with screw holes 132 on the back plate side edge 131. Therefore, the outer frame side edge 21, the front frame side edge 111 and the back plate side edge 131 can be fixed together by the screws, so that the outer frame side edge 21 is ensured not to shake. Meanwhile, by providing the screws on the contact parts 23, the screws can be more stably connected, so that the connection stability can be further improved.

It should be noted that although the contact part 23 with the mounting hole 231 has an annular, not circular, contact surface with the front frame side edge 111, since the screw in the mounting hole 231 also comes into contact with the front frame side edge 111 and the mounting hole 231 has a relatively small size, the heat dissipation effect achieved by the contact part 23 with the screw contacting the front frame side edge 111 may be equal to that achieved by a solid contact part 23 without any screw contacting the front frame side edge 111. Therefore, in calculation of the contact area between the contact part 23 and the front frame side edge 111, the contact area between the contact part 23 and the front frame side edge 111 may be regarded as circular.

Figure 3B:
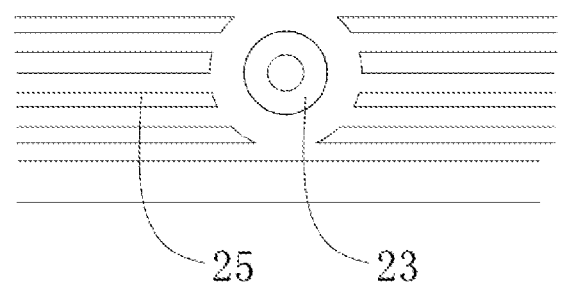
FIG. 3B is an enlarged view of region I in FIG. 3A.

In some optional embodiments, FIG. 5 is a partial sectional view of a complete machine structure at a comb-teeth shaped protruding structure according an embodiment of the present disclosure. As shown in FIG. 5, a comb-teeth shaped protruding structure 25 is provided on an inner surface (i.e., the surface opposite to the front frame side edge 111) of the outer frame side edge 21 and between each two adjacent contact parts 23. The protruding structure 25 is spaced apart from the front frame side edge 111. That is, the two do not contact. The protruding structure 25 is configured to increase strength of the complete machine exterior frame 2. Specifically, as shown in FIG. 3B, the protruding structure 25 is composed of a plurality of ribs arranged at intervals and each extending in the length direction of the outer frame side edge 21. Apparently, the protruding structure 25 may adopt any other structure as long as the strength of the complete machine exterior frame 2 can be increased.

For a complete machine structure to be used for a long time, such as a broadcasting level monitor, it has high requirements on display colors due to the long-time use. However, the long-time use may cause a high temperature of the monitor, and an overhigh temperature of the display module may lead to color coordinate drift, finally resulting in a reduced chromaticity thermal stability of the complete machine structure. In order to solve this problem, in some optional embodiments, as shown in FIGS. 1 and 2, the complete machine structure further includes a rear case 3 connected to the complete machine exterior frame 2, forming a housing capable of receiving the display module 1.

Figure 6:
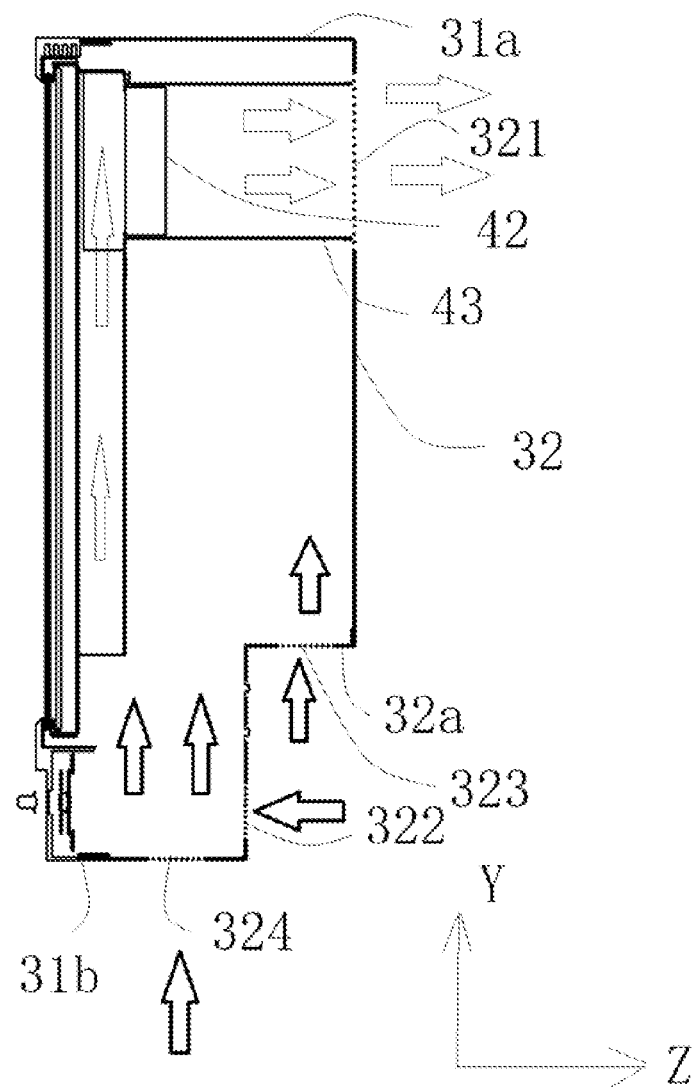
FIG. 6 is a schematic diagram of the structure and principle of a heat dissipation device used in an embodiment of the present disclosure.

Specifically, as shown in FIGS. 6 and 7, the rear case 3 includes a rear plate 32 on a side of the display module 1 away from a light-emitting surface of the display module 1, and a rear case side edge 31 connected to the complete machine exterior frame 2. As shown in FIG. 4, at least part of the rear case side edge 31 is relatively located on an outer side of the outer frame side edge 21 (i.e., a side away from the space for receiving the display module 1), and as shown in FIG. 3A, a plurality of threaded holes 24 are provided on the outer frame side edge 21, and correspondingly, mounting holes (not shown) are provided on the rear case side edge 31. The complete machine structure further includes screws passing through the mounting holes on the rear case side edge 31 and in threaded connection with the threaded holes 24 on the outer frame side edge 21, so that the rear case side edge 31 is fixed to the outer frame side edge 21.

Furthermore, in order to reduce the temperature of the display module 1, as shown in FIG. 6, the rear case side edge 31 and the rear plate 32 form a heat dissipation space on an outer side (i.e., the side away from the light-emitting surface) a back plate 13 of the display module 1, and a heat dissipation device is provided in the heat dissipation space to dissipate heat generated by the display module 1. With the help of this heat dissipation device, rapid heat dissipation of the display module 1 can be implemented. It has been found through experiments that a higher transfer efficiency is achieved by dissipating heat from the rear case 3 side with the heat dissipation device, which can effectively reduce an overall temperature of the display module 1, so that the color coordinate drift is avoided and the chromaticity thermal stability of the complete machine structure is improved.

It should be noted that the surface 210 of the outer frame side edge 21 away from the display module 1 may not include a surface not exposed to the external, because this portion will not be touched by a user in normal use of the complete machine structure. In other words, $T_2$ may be regarded as a maximum allowable temperature on the surface of outer frame side edge 21 that may be touched by a user. For example, the surface 210 of the outer frame side edge 21 away from the display module 1 may not include the surface covered by the rear case side edge 31.

The heat dissipation device may have various structures. For example, the heat of the display module 1 may be dissipated through a combination of a fan with an air inlet and an air outlet on the rear case 3. In some optional embodiments, at least one air outlet is provided at a position on the rear plate 32 near the rear case side edge at a sky side, and a first air inlet is provided at a position on the rear plate 32 near the rear case side edge at a ground side. when the complete machine structure is placed on a horizontal plane in a designated mode, the outer surface of the rear case side edge at the sky side faces upward, and the outer surface of the rear case side edge at the ground side faces downward. That is, the rear case side edge at the sky side is an upper side edge, and the rear case side edge at the ground side is a lower side edge. The designated mode is usually a customary placement orientation of the complete machine structure. For example, if the complete machine structure has a stand, the designated mode is such that when the complete machine structure is placed on the horizontal plane, the stand is disposed at a bottom of the complete machine structure to support the complete machine structure.

In this manner, air from the external environment may enter the heat dissipation space through a first air inlet near the lower side edge, and then carry heat from the display module 1 and exit from the air outlet near the upper side edge, thereby implementing circulation of the air. Since hot air rises up, by providing the air outlet above the air inlet, the heat produced by the display module 1 can be discharged more rapidly, thereby improving the heat dissipation efficiency.

In a specific embodiment, as shown in FIG. 6, a first air inlet 322 is provided at a position on the rear plate 32 near the lower side edge 31b (i.e., the rear case side edge at the ground side); and an air outlet 321 is provided at a position on the rear plate 32 near the upper side edge 31a (i.e., the rear case side edge at the sky side).

On the basis, in order to increase the air intake efficiency, an optional second air inlet 324 is further provided at a position near the first air inlet 322 on the lower side edge 31b (i.e., the rear case side edge at the ground side). In this manner, air from the external environment may enter the heat dissipation space through both the first air inlet 322 near the lower side edge and the second air inlet 324 on the lower side edge 31b. Further optionally, as shown in FIG. 6, a part of the rear plate 32 has a step structure. Also, when the complete machine structure is placed on a horizontal plane in a designated mode, an outer surface of the lower side edge 32a having the step structure faces downward. On this basis, a third air inlet 323 may be provided on the lower side edge 32a having the step structure. Air from the external environment enters the heat dissipation space through the first air inlet 322, the second air inlet 324 and the third air inlet 323. The air from the external environment flows into the heat dissipation space in a direction shown by the thick line arrows in FIG. 6.

Figure 7A:
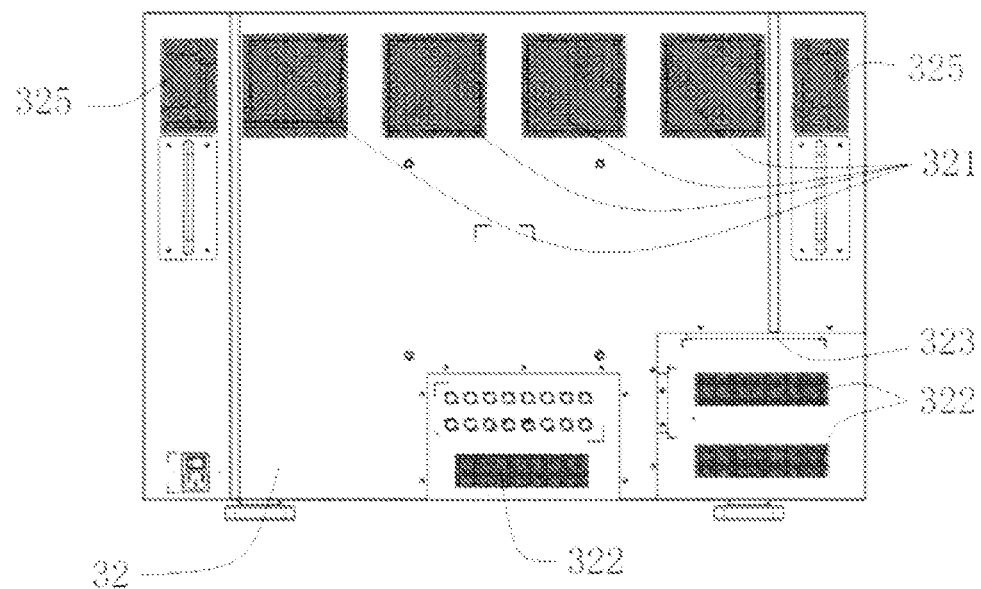
FIG. 7A is a structural diagram of a rear case used in an embodiment of the present disclosure.

Moreover, as shown in FIG. 6, the heat dissipation device includes at least one fan 42. The fan 42 is disposed at a position near the air outlet 321, and configured to blow air to the air outlet 321, so that heat generated by the display module 1 can be discharged from the air outlet 321 along with the airflow. In some optional embodiments, the number of fans 42 is less than or equal to the number of air outlets 321, and different fans 42 are disposed opposite to different air outlets 321. The air in the heat dissipation space may carry the heat generated by the display module 1 to be discharged from the air outlet 321, and a path of the heat generated by the display module 1 to be discharged from the heat dissipation space is shown by the thin line arrows in FIG. 6. For example, as shown in FIG. 7A, a total of six air outlets are provided, of which four air outlets 321 are correspondingly provided with four fans 42, while the remaining two air outlets 325 may not have corresponding fans 42. In an embodiment, the six air outlets are disposed at positions of a same height. Further optionally, the two air outlets 325 are respectively located on left and right sides of the four air outlets 321. Apparently, in practical applications, the number and arrangement mode of the air outlets may be set freely as specifically needed, and are not particularly limited in the embodiments of the present disclosure.

In order to control the temperature of the whole set rear case 3 below the maximum allowable temperature, in some optional embodiments, the temperature of the whole set rear case 3 may be controlled by selecting an appropriate number and specification of fans. The specification of the fan includes, for example, CMM, which represents a volume of air discharged by the fan per minute in m³/min.

In some optional embodiments, a volume of air discharged by all fans 42 per minute is defined as a CMM sum value, which is greater than or equal to a ratio of a CMM target value to an aperture ratio of the air outlet 321 corresponding to the fan 42. With this arrangement, it is ensured that the temperature of the rear case 3 is controlled below the maximum allowable temperature. After the CMM sum value of all fans 42 is obtained by calculation, fans 42 of an appropriate number and an appropriate CMM may be selected, as long as the CMM sum value $CMM_{sum}$ of the fans

42 is greater than or equal to the ratio of the CMM target value to the aperture ratio of the air outlet 321.

It should be noted that the aperture ratio of the air outlet 321 is equal to a ratio of an aperture area of the air outlet 321 to an original area of that air outlet before providing the apertures. Specifically, the original area may be understood as an area encircled by an outer contour of a hollow region corresponding to the air outlet 321; and the hollow region corresponding to the air outlet 321 is an integral region formed a combination of the apertures in the air outlet 321 and non-hollow parts separating the apertures. For example, FIG. 7C shows a hollow region 3210 of the air outlet, apertures 3211 of the air outlet 321, and non-hollow parts 3212 separating the apertures. The hollow region 3210 corresponding to the air outlet 321 has a rectangular outer contour. In an embodiment, the hollow region 3210 has a square outer contour. It should be noted that when a plurality of air outlets 321 are provided, different air outlets 321 may have different aperture ratios, and in this case, the aperture ratios of the air outlets 321 may be obtained from a ratio of a sum aperture area of the air outlets 321 corresponding to all fans 42 to a sum original area of the air outlets before the air outlets 321 corresponding to all fans 42 are provided with apertures.

The CMM target value may be calculated by:

$$CMM_{target} = \frac{Q}{\Delta T \times M \times C_p}$$

where $CMM_{target}$ is the CMM target value; $\Delta T$ is a difference between the temperature of the display module 1 and 38° C. when an ambient temperature is 38° C.; M is a unit air mass of standard air; $C_p$ is an air constant pressure specific heat of standard air; and Q is heat generated by the complete machine structure in 1 minute of operation.

Specifically, Q may be calculated by:

$$\frac{P \times 60}{4.2},$$

in cal, where 60 means that the display module 1 is operated for 60 s; 4.2 means that 4.2 J heat is required to raise the temperature of water having a weight of 1 g at a temperature of 0° C. by 1° C.; and P is the power of the display module 1.

In a specific embodiment, at an ambient temperature of 38° C., the temperature of the display module 1 is in a range of 40° C. to 60° C.

It will be appreciated that the complete machine structure may be operated within a certain ambient temperature range, and the set ambient temperature of 38° C. is one of the operable ambient temperatures and may correspond to an ambient temperature in outdoor use in a certain area for a certain time (for example, summer). With 38° C. as the ambient temperature used in tests, an operating state of the complete machine structure in a relatively extreme environment can be simulated, and thus a CMM sum value in a relatively wide application range is obtained.

In some embodiments, at the ambient temperature of 38° C., the temperature of the display module 1 may be 40° C., 41° C., 42° C., 43° C., 44° C., 45° C., 46° C., 47° C., 48° C., 49° C., 50° C., 51° C., 52° C., 53° C., 54° C., 55° C., 56° C., 57° C., 58° C., 59° C. or 60° C., and values between adjacent values may be rounded and regarded as the above integer temperatures.

In some embodiments, at the ambient temperature of 38° C., the temperature of the display module 1 may be greater than or equal to 45° C. Preferably, at the ambient temperature of 38° C., the temperature of the display module 1 may be less than or equal to 48° C., so as to ensure normal use of the display module 1.

The temperature of the display module 1 may be understood as an actual temperature of the display module 1 detected on a printed circuit board thereof at a preset ambient temperature when the complete machine structure is turned on to present a static image and reaches a temperature stable state. In a specific test, the static image may be an image in which all pixels display an L255 state. In a specific test, the time period during which no notable change in temperature is found on different parts of the complete machine structure may be greater than or equal to 30 minutes.

The equation for the CMM target value is derived through the following process:

At normal atmospheric pressure, the heat discharged by the fan, $Q_{discharge}$, may be expressed by:

$$Q_{discharge} = Cp \times W \times \Delta T$$

where W is a weight of air discharged per minute, and W=$CMM_{target}$×M. By substituting it into the above equation, it can be obtained that:

$$Q_{discharge} = Cp \times CMM_{target} \times M \times \Delta T$$

For convenience of calculation, suppose that the operation heat Q of the display module 1 is equal to the heat $Q_{discharge}$ discharged by the fan, and on this basis, by substituting the equation for the operation heat Q of the display module 1 into the equation for the head $Q_{discharge}$, it can be obtained that:

$$Q = Q_{discharge} = Cp \times CMM_{target} \times M \times \Delta T$$

Thereby, it can be derived that the equation for the CMM target value is:

$$CMM_{target} = \frac{Q}{\Delta T \times M \times C_p}$$

For convenience of calculation, suppose that the air is standard air, where the temperature of standard air is 20° C., the atmospheric pressure is 760 mmHg, and the humidity is 65%, and the unit air mass M is 1200 g/m³. For convenience of calculation, the air constant pressure specific heat $C_p$ of the standard air takes 0.24 kcal/kg° C. (i.e., 0.24 cal/g° C.).

Further, $$CMM_{target} = \frac{Q}{\Delta T \times M \times C_p} = \frac{P \times 60}{4.2} \times \frac{1}{\Delta T \times M \times C_p}$$

By substituting the unit air mass M of 1200 g/m³ and the air constant pressure specific heat $C_p$ of 0.24 cal/g° C. into the above equation, it can be derived that:

$$CMM_{target} = \frac{Q}{\Delta T \times M \times C_p} = \frac{P \times 60}{4.2} \times \frac{1}{\Delta T \times M \times C_p} =$$

$$\frac{P \times 60}{4.2} \times \frac{1}{\Delta T \times 1200 \times 0.24} \approx \frac{0.05 \times P}{\Delta T}$$

Taking a display panel of 31.5 inch as an example, the ambient temperature is set to 38° C.; the maximum allowable temperature of the display module 1 is 48° C.; and the power P of the display module 1 is about 400 W. Under these conditions, it can be obtained from the above equations that:

$$CMM_{target} \approx \frac{0.05 \times P}{\Delta T} = \frac{0.05 \times 400}{(48-38)} = 2(m^3/\text{min}).$$

If the aperture ratio of the air outlet is 62%, then the CMM sum value of the fans 42 is about 2/0.6=3.332 m³/min. On this basis, four fans, each having a CMM value of 0.92 m³/min, can be selected, and a CMM sum value of the four fans is 0.92×4=3.68 m³/min, which is greater than the above CMM sum value (3.332 m³/min). With such designs, the temperature of the display module 1 (i.e., the actual temperature of the display module 1 detected on a printed circuit board thereof at the preset ambient temperature of 38° C. when the complete machine structure is turned on to present a static image and reaches a temperature stable state, where in the test, the static image is an image in which all pixels display an L255 state.) can be controlled below 48° C. Meanwhile, the temperature of the rear case 3 can be controlled below 39° C., so that the temperature of the case of the complete machine structure is in a comfortable temperature range, and the use experience of the user is improved.

Figure 7B:
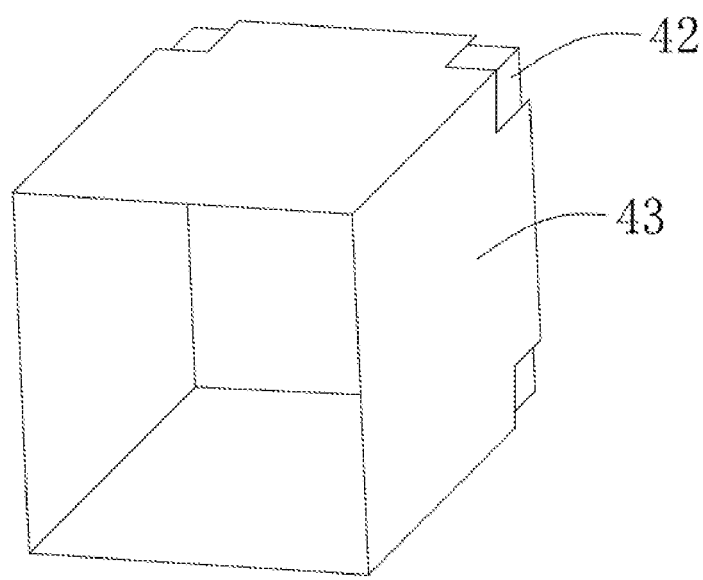
FIG. 7B is a schematic structural diagram of a baffle used in an embodiment of the present disclosure.
Figure 7C:
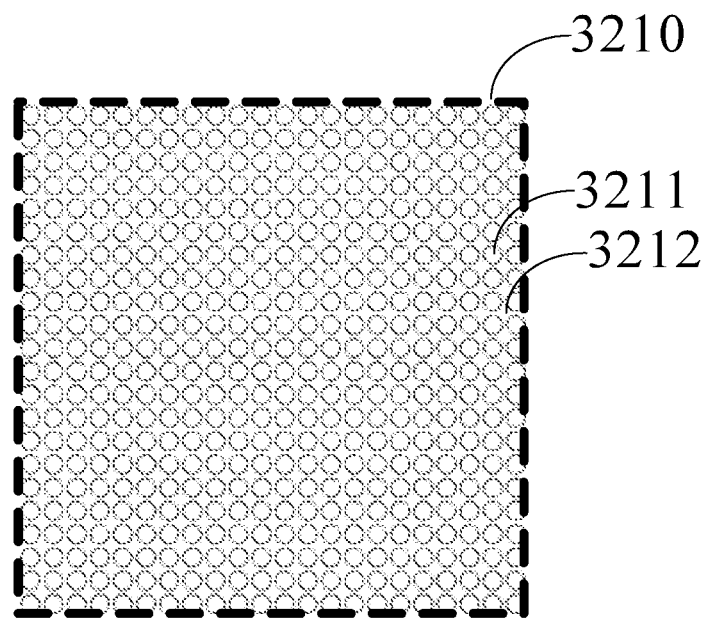
FIG. 7C is a plan view of an air outlet used in an embodiment of the present disclosure.

In some optional embodiments, as shown in FIGS. 2, 6 and 7B, the heat dissipation device further includes a baffle 43 between a fan 42 and an air outlet 321 opposite to the fan. For example, as shown in FIG. 7B, the baffle 43 is a rectangular box that covers and surrounds the fan 42. The four fans 42 are correspondingly provided with four baffles 43, each configured to form a discharge channel between the corresponding fan 42 and the air outlet 321 opposite to the fan. In this manner, it helps to improve a discharge efficiency of the air from the heat dissipation space.

Figure 8:
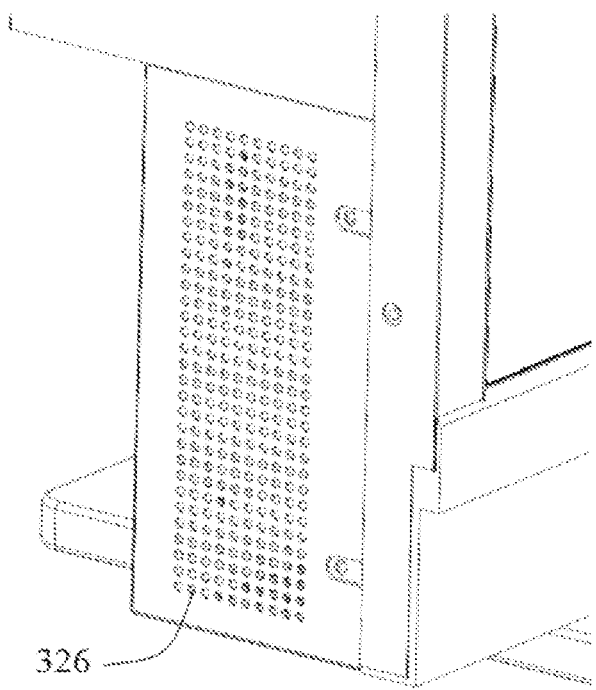
FIG. 8 is a structural diagram of a heat dissipation hole used in an embodiment of the present disclosure.

In some optional embodiments, as shown in FIGS. 1 and 8, a fourth air inlet 326 is further provided on the rear case side edge of the rear case 3, to further increase an amount of the supplied air. In an embodiment, when the complete machine structure is placed on the horizontal plane, the fourth air inlet 326 may be provided on the rear case side edges on the left and right sides of the rear case 3, and near the rear case side edge at the lower side.

Figure 9:
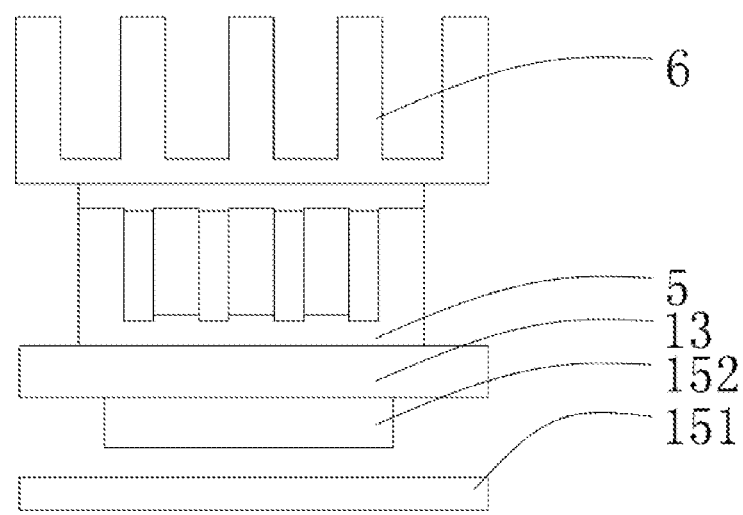
FIG. 9 is a schematic structural diagram of a semiconductor heat conductive module and a heat sink assembly used in an embodiment of the present disclosure.
Figure 10:
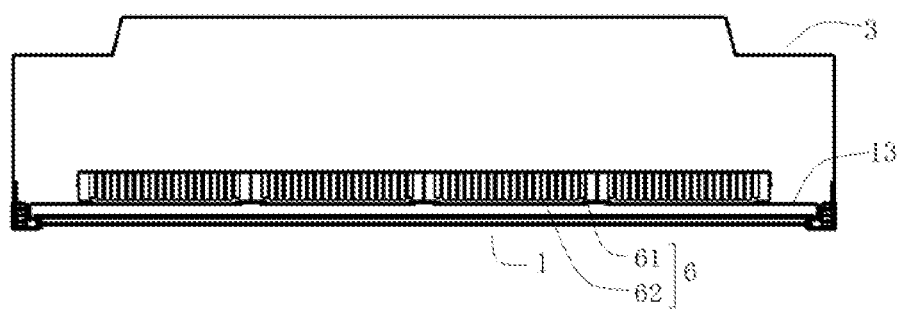
FIG. 10 is a schematic structural diagram showing a heat sink assembly assembled on a display module according to an embodiment of the present disclosure.

In some optional embodiments, as shown in FIGS. 9 and 10, the complete machine structure further includes a semiconductor heat conductive module 5 and a heat sink assembly 6. The semiconductor heat conductive module 5 is mounted between the back plate 13 of the display module 1 and the heat sink assembly 6, and the semiconductor heat conductive module 5 is connected to the heat sink assembly 6 and configured to conduct heat generated by the display module 1 to the heat sink assembly 6. For example, as shown in FIG. 9, the semiconductor heat conductive module 5 is mounted on the back plate 13 of the display module 1, and located on a side away from the backlight module (only an optical film layer 151 and an LED panel 152 are shown in FIG. 9), between the back plate 13 and the heat sink assembly 6. The heat sink assembly 6 is connected to the semiconductor heat conductive module 5, and located on a side of the semiconductor heat conductive module 5 away from the back plate 13. The semiconductor heat conductive module 5 is configured to conduct heat generated by the display module 1 to the heat sink assembly 6, and then to the heat dissipation device. By means of the semiconductor heat conductive module 5 and the heat sink assembly 6, heat generated by the display module 1 can be timely conducted to the heat dissipation device, and heat dissipation is sped up. As shown in FIG. 10, the heat sink assembly 6 may include grid structures 61 on a heat sink base 62 and on a side of the heat sink base 62 away from the back plate 13 of the display module 1. Preferably, the base 62 and the grid structures 61 form an integral structure, i.e., are made of a same material through a single process. Preferably, the grid structures extend along a direction from the ground side to the sky side of the complete machine structure, so that the air can flow between the grid structures to take away heat. The semiconductor heat conductive module 5 is not shown in FIG. 10, and only the position and structure of the heat sink assembly 6 are schematically shown.

Apparently, embodiments of the present disclosure are not limited thereto, and in practical applications and based on the actual need, it is also possible that only the heat sink assembly 6 is provided, while the semiconductor heat conductive module 5 is omitted. For example, in FIG. 6, the heat sink assembly 6 is disposed adjacent to the back plate 13 of the display module 1. During normal operation of the whole set structure, the heat sink assembly 6 has In summary, the complete machine structure provided in the embodiments of the present disclosure includes a display module and a complete machine exterior frame. The complete machine exterior frame includes at least one outer frame side edge each located on a side of the front frame side edge of the display module relatively away from the display panel, and in contact with the front frame side edge. A total contact area of all outer frame side edges and corresponding front frame side edges satisfies:

$$S \leq \frac{L \times P}{K \times (T_1 - T_2)}.$$

With the total contact area satisfying the above condition, heat transferred from the display module to the complete machine exterior frame can be reduced, so that the temperature of the complete machine exterior frame will not become too high, the service life of the complete machine exterior frame can be increased, and the use experience can be improved, while ensuring sufficient strength of the outer frame side edge, so that strength of the complete machine exterior frame, and thus the structural stability, are improved.

It should be noted that the expression "a1 to a2" used in the present disclosure for defining a range includes the endpoint values. For example, the maximum width L of the outer frame side edge 21 may be designed between 11.5 mm to 12.5 mm, which includes the two endpoint values 11.5 mm and 12.5 mm, that is, the maximum width of the outer frame side edge 21 may be 11.5 mm or 12.5 mm.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A complete machine structure, comprising a display module and a complete machine exterior frame, wherein the display module comprises a display panel and a front frame, the front frame comprises a front frame side edge on an outer side of a side edge of the display panel; the complete machine exterior frame comprises at least one outer frame side edge each located on a side of the front frame side edge away from the display panel, and in contact with the front frame side edge, and a total contact area of all outer frame side edges and corresponding front frame side edges satisfies:

$$S \le \frac{L \times P}{K \times (T_1 - T_2)}$$

where S is the total contact area; L is a maximum width of the outer frame side edge at a position where the outer frame side edge is in contact with the front frame side edge in a direction perpendicular to a contact surface of the outer frame side edge with the front frame side edge; P is a power of the display module, which is a sum of a power of the display panel and a power of a backlight module of the display module; K is a heat conductivity coefficient of the outer frame side edge; $T_1$ is a temperature of the display module at an ambient temperature of 20° C., wherein the temperature of the display module is defined as an actual temperature of the display module detected on a printed circuit board thereof at a preset ambient temperature when the display module of the complete machine structure is turned on to present a static image and reaches a temperature stable state; $T_2$ is a maximum allowable temperature on a surface of the outer frame side edge away from the display module at an ambient temperature of 20° C.; and $T_2$ is less than or equal to 50° C.

2. The complete machine structure according to claim 1, wherein the total contact area of all outer frame side edges and corresponding front frame side edges satisfies:

$$r \times \left(\frac{L \times P}{K \times (T_1 - T_2)}\right) \le S \le \frac{L \times P}{K \times (T_1 - T_2)}$$

where r takes a value in a range of [0.5,1).

3. The complete machine structure according to claim 2, wherein r=0.8.

4. The complete machine structure according to claim 1, wherein the maximum allowable temperature $T_2$ of the outer frame side edge is 38° C.

5. The complete machine structure according to claim 1, wherein the power of the display module is greater than or equal to 190 W.

6. The complete machine structure according to claim 1, wherein the outer frame side edge is spaced apart from the front frame side edge, the outer frame side edge has a contact structure, and a surface of the contact structure in contact with the front frame side edge is the contact surface; and a number of the contact surface is two or more, the two or more contact surfaces being uniformly distributed on an inner surface of the outer frame side edge facing the front frame side edge; or a number of the contact surface is one, the one contact surface being in linear contact with the front frame side edge.

7. The complete machine structure according to claim 6, wherein the plurality of contact surfaces have a same shape and a same area.

8. The complete machine structure according to claim 6, wherein the contact structure comprises a plurality of contact parts, each of the contact parts has one of the contact surfaces thereon; at least part of the contact parts are provided with mounting holes penetrating through the contact parts in a direction perpendicular to the contact surface; and the complete machine structure further comprises screws, a number of the screws is the same as a number of the mounting holes, and the screws pass through the mounting holes in one-to-one correspondence to be connected to the front frame side edge.

9. The complete machine structure according to claim 8, wherein a comb-teeth shaped protruding structure is provided on the inner surface of the outer frame side edge and between each two adjacent contact parts, and the protruding structure is spaced apart from the front frame side edge.

10. The complete machine structure according to claim 1, wherein the complete machine structure further comprises a rear case, the rear case comprises a rear plate on a side of the display module away from a light-emitting surface of the display module, and a rear case side edge connected to the complete machine exterior frame, wherein the rear case side edge and the rear plate form a heat dissipation space on an outer side of a back plate of the display module, a heat dissipation device is provided in the heat dissipation space to dissipate heat generated by the display module; and the rear case comprises an air inlet and an air outlet.

11. The complete machine structure according to claim 10, wherein at least one air outlet is provided at a position on the rear plate near the rear case side edge at a sky side, and a first air inlet is provided at a position on the rear plate near the rear case side edge at a ground side; and the heat dissipation device comprises a fan, and the fan is disposed at a position near the air outlet and configured to blow air to the air outlet.

12. The complete machine structure according to claim 11, wherein a second air inlet is further provided at a position near the first air inlet on the rear case side edge at the ground side.

13. The complete machine structure according to claim 11, wherein a volume of air discharged by all fans per minute is defined as a CMM sum value, which is greater than or equal to a ratio of a CMM target value to an aperture ratio of the air outlet; and the CMM target value $CMM_{target}$ satisfies:

$$CMM_{target} = \frac{Q}{\Delta T \times M \times C_p}$$

where $\Delta T$ is a difference between the temperature of the display module and 38° C., when an ambient temperature is 38° C.; M is a unit air mass of standard air; Cp is a constant pressure specific heat of standard air; and Q is heat generated by the complete machine structure in one minute of operation; and the temperature of the display module is in a range of 40° C. to 60° C.

14. The complete machine structure according to claim 13, wherein at an ambient temperature of 38° C., the temperature of the display module is greater than or equal to 45° C., and/or, the temperature of the display module is less than or equal to 48° C.

15. The complete machine structure according to claim 11, wherein the heat dissipation device further comprises a baffle, and the fan is opposite to one of the air outlets; and the baffle is disposed between the fan and the air outlet opposite to the fan, and configured to form a discharge channel between the fan and the air outlet.

16. The complete machine structure according to claim 1, wherein the complete machine structure further comprises a heat sink assembly on a side of the back plate of the display module.

17. The complete machine structure according to claim 16, wherein the complete machine structure further comprises a semiconductor thermally conductive module, the semiconductor heat conductive module is mounted between the back plate of the display module and the heat sink assembly; and the semiconductor heat conductive module is connected to the heat sink assembly and configured to conduct heat generated by the display module to the heat sink assembly.

* * * * *